United States Patent [19]

Kurakami

[11] Patent Number: 4,780,851
[45] Date of Patent: Oct. 25, 1988

[54] SEMICONDUCTOR MEMORY DEVICE HAVING IMPROVED REDUNDANT STRUCTURE

[75] Inventor: Osamu Kurakami, Tokyo, Japan
[73] Assignee: NEC Corporation, Tokyo, Japan
[21] Appl. No.: 813,216
[22] Filed: Dec. 24, 1985
[30] Foreign Application Priority Data Dec. 24, 1984 [JP]  Japan .................. 59-272416

[51] Int. Cl.⁴ .............................. G11C 7/00
[52] U.S. Cl. ................................. 365/200
[58] Field of Search ............... 365/200, 201, 96; 371/10

[56] References Cited

U.S. PATENT DOCUMENTS 4,546,455 10/1985 Iwahashi et al. ............... 365/200
4,639,895 1/1987 Iwahashi et al. ............... 365/200

OTHER PUBLICATIONS

P. W. Cook et al., "Memory System Fabrication Using Laser Formed Connections", IBM Technical Disclosure Bulletin, vol. 17, No. 1, June 1974, pp. 245–247.

Primary Examiner—Joseph A. Popek
Attorney, Agent, or Firm—Sughrue, Mion, Zinn, Macpeak, and Seas

[57] ABSTRACT

A memory device provided with a redundant scheme in which a leakage current and unnecessary power consumption due to defective memory cells are suppressed is disclosed. The memory device has an array of memory cells which are divided into a plurality of sections, and a branch power supply line is provided between each section and adapted to be connected to a common power supply line, the branch power supply line for a defective section including defective memory cell being cut to electrically isolate the defective section from the common power supply line.

10 Claims, 4 Drawing Sheets

SEMICONDUCTOR MEMORY DEVICE HAVING IMPROVED REDUNDANT STRUCTURE

BACKGROUND OF THE INVENTION

The present invention relates to a semiconductor memory device fabricated as an integrated circuit, and particularly to a static memory device of the type having a redundant array of memory cells for replacing a defective memory cell.

Recently, in order to fulfil the demands for large capacity of memory devices such as memories having 256K-bits or more, the sizes of semiconductor chips on which memories are fabricated have become larger. Therefore, the yield of perfectly good chips have become low. Namely, the possibility that at least one defective memory cell exists in each of memory device chip has become large. Accordingly, in order to save such memory device chip having a small number of defective cells, a redundant scheme has been employed. Namely, at least one redundant row or column of memory cells are provide together with a regular array of memory cells and, in the case where at least one defective memory cell is present in the regular array, such defective memory cell is functionally replaced with a good memory cell in the redundant row or column of memory cells. This redundant scheme is advantageous in improving the yield of memory chips and reducing the cost in production of memory chips.

However, for a static type memory device employing a flip-flop as a memory cell, it has found that even a defective memory cell in a regular array is replaced with a good memory cell in a redundant array and access to the defective cell is inhibited, abnormal current still flows through the defective memory cell or cells and hence such memory device fails to satisfy a current characteristic as required.

SUMMARY OF THE INVENTION

It is an object of the present invention to provide a static memory device having an improved redundant structure which suppresses an abnormal current.

The memory device according to the present invention is of the type having a plurality of memory cells which are divided into a plurality sections, a predetermined number of the sections being adapted to be accessed, the remaining part of the sections being inhibited from being accessed, and featured in that a plurality of power supply lines are provided for the sections, the power supply lines being connected to a common trunk power supply line, and that the power supply line or lines associated to the above remaining part of sections are electrically isolated from the common trunk line.

According to the present invention, supply of a power to the remaining part of the sections is inhibited, and therefore even if there is a leakage current path in the above remaining part of sections, there is no consumption of current in the remaining part of sections. Thus, a leakage current or unnecessary power consumption in the remaining part of sections can be effectively avoided.

DETAILED DESCRIPTION OF THE INVENTION

Figure 1:
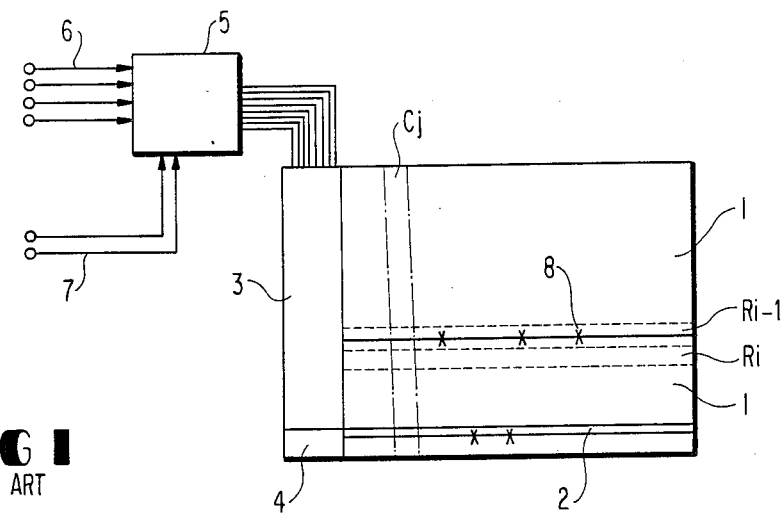
FIG. 1 is a schematic block diagram showing a memory device according to a prior art.

Referring to FIG. 1, a conventional static memory device having a redundant scheme is described. A main memory array 1 includes a plurality of memory cells arranged in matrix form of rows (.... $R_i-1$, $R_i$, ....) and columns (.... Cj ....). Adjacent to the main memory array 1, a redundant memory array 2 is provided. The redundant array 2 includes at least one row of memory cells, and shares the common columns with the main array. A main row decoder 3 is provided for the main array 1 for selecting rows of the main array 1 while a redundant row decoder 4 is provided for the redundant array 4 to select a row of the redundant array 2. An address conversion circuit 5 receives row address signals and redundant address indication signals 7 for controlling the row decoder 3 and the redundant decoder 4 in such manner that when a row, e.g. $R_i-1$ including a defective memory cell 8 coupled to a word line of the row $R_i-1$ is to be accessed, instead of the row $R_i-1$, the row of the redundant array 2 is selected by the redundant decoder 4. The feature thus described is well known to the man skilled in this field.

Figure 2:
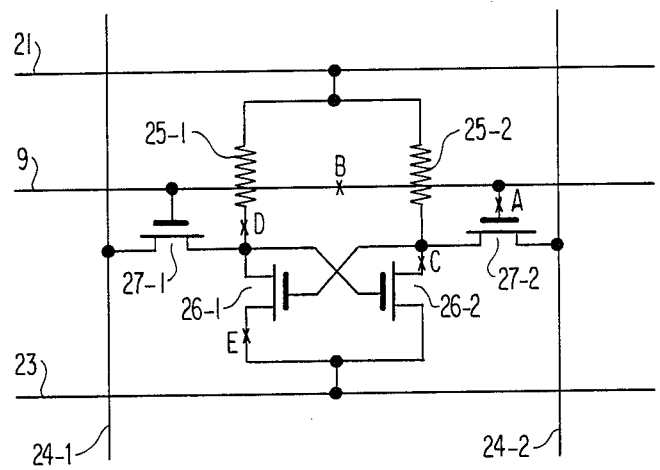
FIG. 2 is a schematic circuit diagram showing a major part of FIG. 1.

Referring to FIG. 2, a memory cell in the memory cell array 1 in FIG. 1 is comprised of a flip-flop made of resistors 25-1 and 25-2 as load elements and driver transistors 26-1 and 26-2 and a pair of transfer gate transistors 27-1 and 27-2 for connecting the flip-flop to a pair of digit lines 24-1 and 24-2 in response to a level of a word line 9. A power voltage (VCC) line 21 and a reference voltage (GND) line 23 are arranged in parallel with the word line 9 in each row. The redundant array 2 has the same arrangement of memory cells as the main array 1.

A defect or defects in a memory cell may be caused by a cut B of the word line 9, a incomplete connection A between the gate of the transfer gate transistor e.g. 27-2 and the word line 9, and imperfect junction C, D or E of the driver transistors 26-1, 26-2. The defective memory cell 8 in FIG. 1 thus has one or more of these defects A to E. If the defective memory cell 8 has the defect A or B, it can be replaced by a redundant cell according to the redundant scheme. However, for the defective memory cell having the imperfect junction C, D or E, there is a leak current between the transistor and a semiconductor substrate. Accordingly, it has been difficult to obtain a good memory chip which satisfies a required current specification.

Figure 3:
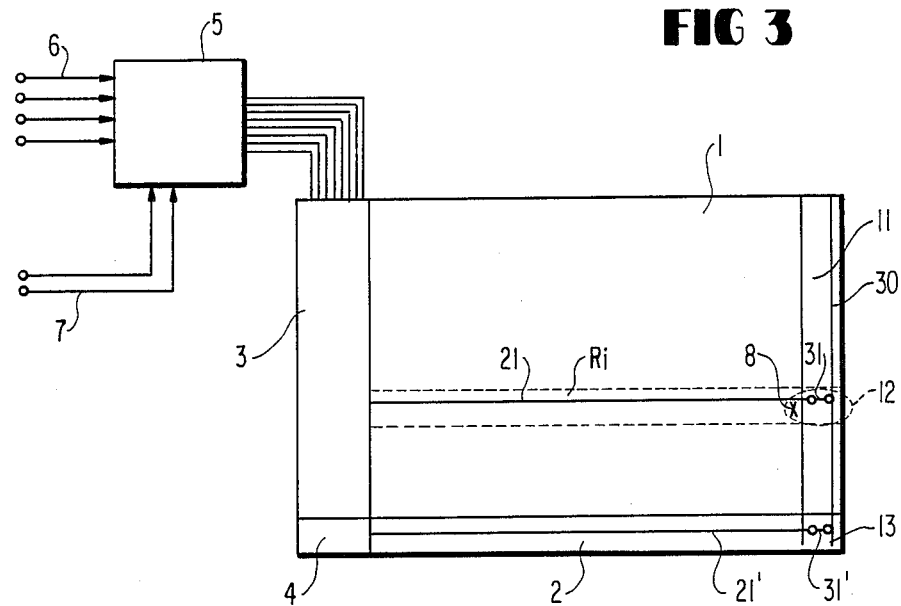
FIG. 3 is a schematic block diagram showing a memory device according to an embodiment of the invention.

Referring to FIG. 3, a memory device according to the present invention is explained.

In FIG. 3, the portions corresponding to those in FIG. 1 are designated by the same reference numbers. According to this embodiment, power supply programming areas 11 and 13 are provided for the main memory array 1 and the redundant memory array 2, respectively, for selectively inhibiting the supply of a power to a row including a defective memory cell in the main memory array 1 or to the row of the redundant array 2, if there is no defective cell in the array 1. A trunk power supply line 30 extends through the areas 11 and 13 in vertical direction and in parallel with the columns of the arrays 1 and 2, as illustrated and a branch power supply line 21 or 21' is provided in each row of the arrays 1 and 2. The branch power line 21 and 21' are connected to the trunk power supply line 30 on the areas 11 and 13 via programming lines 31 and 31', respectively which are subjected to a selective cut. In the case where the row $R_i$ includes at least one defective memory cell 8, the branch power supply line 21 of the row $R_i$ is electrically isolated from the trunk power supply line 30 by cutting its programming line 31. While, in the case where all the memory cells are good in the main array 1, branch power supply line 21' or lines are electrically isolated from the trunk power supply line 30 by cutting their programming lines 31' on the area 13 in order to reduce power consumption of the memory cells in the redundant array 2. But, in the case where the reduction in the power consumption due to the redundant array 2 is not necessary, the branch power supply line or lines 21' in the redundant array 2 are left uncut from the trunk power supply line 30.

Figure 4:
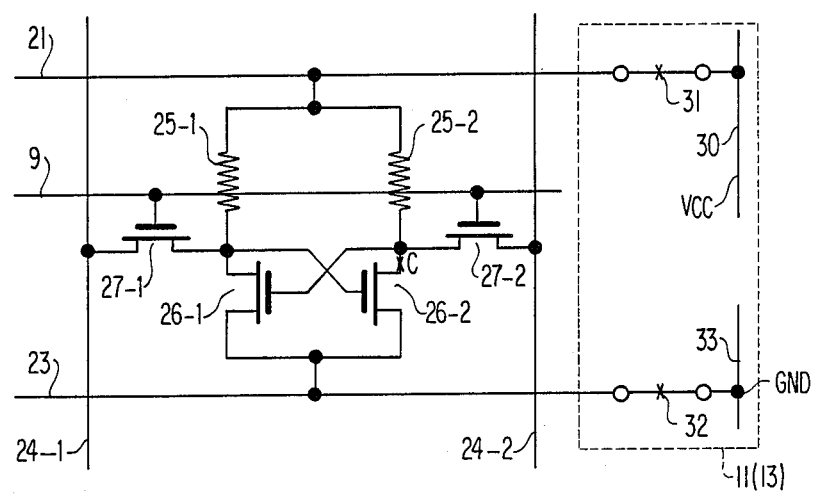
FIG. 4 is a schematic circuit diagram showing a major part of FIG. 3.

A portion 12 including a defective cell 8 and the programming area 31 in FIG. 3 is shown in more detail in FIG. 4.

In FIG. 4, the portions corresponding to those in FIG. 2 are designated by the same reference numbers. As the trunk power supply line 30, a trunk Vcc line 30 is provided and in addition, a trunk ground line 33 is provided. The branch Vcc line 21 and a branch ground line 23 in each row are coupled to the Vcc line 30 and the ground line 33 through connecting lines 31 and 32 on the programming area 11. In the case where the cell 8 has an imperfect junction C in the transistor 26-2 and it is to be replaced by the cell in the redundant array 2, the connecting line 31 and/or 32 are cut so that the branch line 21 and/or the line 23 are electrically isolated from the line 30 and/or the line 33. Accordingly, if there is a leakage path between a drain of the transistor 26-2 and a substrate (not shown) due to the defect C, no electric current flows through such leakage path because the defective cell is not supplied with any power supply.

The connecting lines 31 and/or 32 are cut by laser beam by a known technique of laser cut on a chip. The lines 31 and 32 may be formed by a polycrystalline silicon or aluminum independent from the lines 21 and 23, or as the consecutive wirings from the lines 21 and 23, respectively. Thus, a leakage current due to a row including defective cell which is replaced by the redundant row of good memory cells can be eliminated by inhibiting the supply of a power voltage to the row including the defective memory cell.

Figure 5:
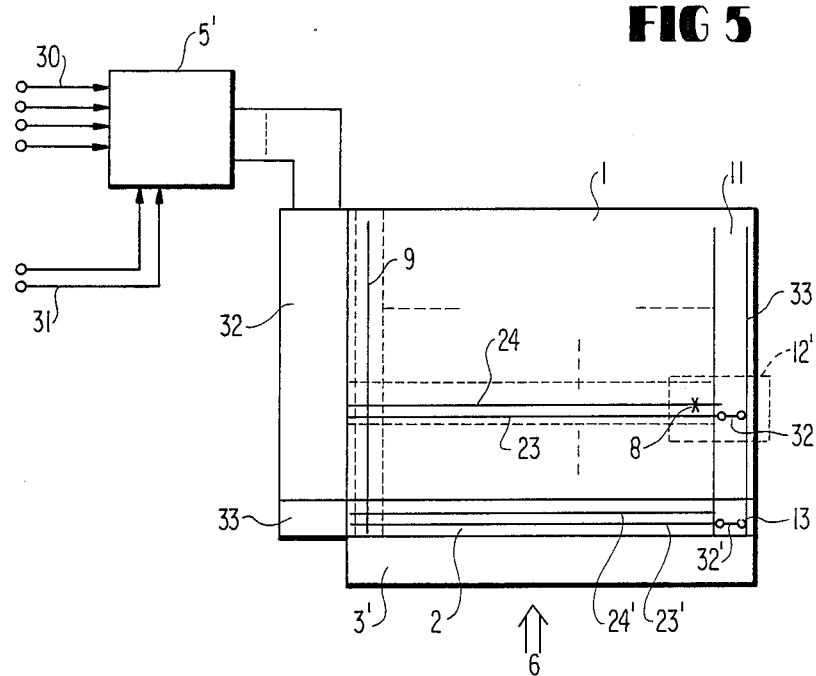
FIG. 5 is a schematic block diagram showing a memory device according to another embodiment.
Figure 6:
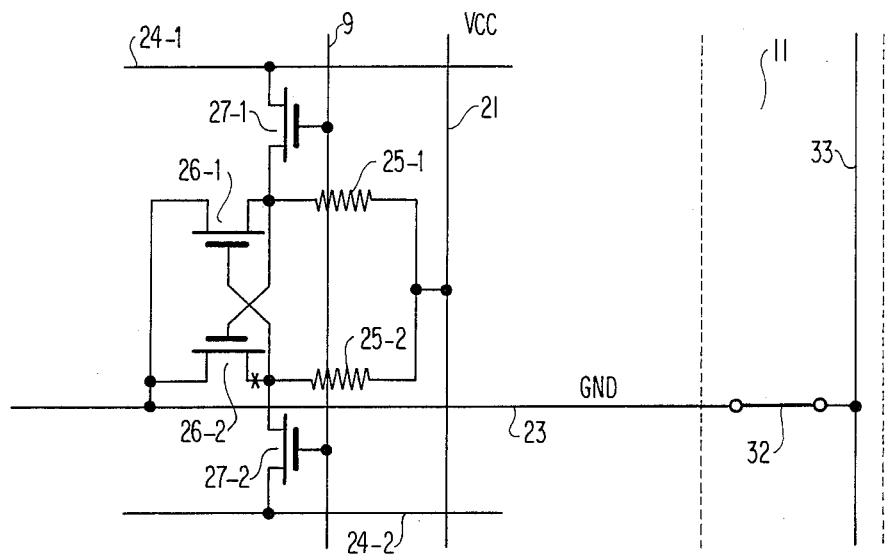
FIG. 6 is a schematic circuit diagram of a major part in FIG. 5.
Figure 7:
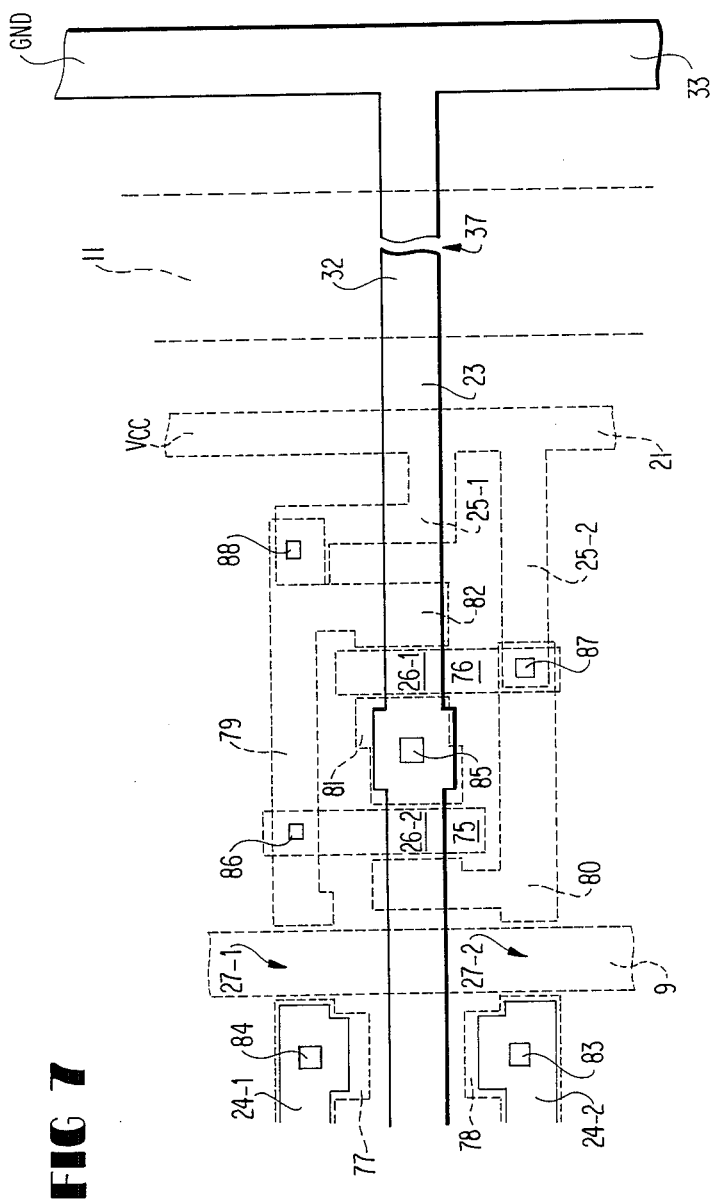
FIG. 7 is a plan view showing an example of a practical layout pattern of the major part of FIG. 6.

Referring to FIGS. 5 to 7, a memory device according to another embodiment of the invention will be described. FIG. 5 shows a major arrangement of this embodiment. In this embodiment, different from the arrangement of FIG. 3, each digit line pair 24 (24') is arranged in each row, i.e., in lateral direction while each word line 9 is arranged in each column, i.e., in vertical direction in the main array 1 (the redundant array 2). A word decoder 3' selects one of word lines in the arrays 1 and 2 according to word address signals 6. A bit address conversion circuit 5' receives bit address signals 30 and bit redundant address indication signals 31 for selecting one of digit line pairs 24 and 24' in the main array 1 and the redundant array 2. If there is a defective memory cell such as one as indicated by the reference 8, one of columns 24' in the redundant array is selected in place of that digit line pair in the main array 1. In this embodiment, a ground voltage line 23 is provided in each row in parallel with each digit line pair 24, 24' in the respective arrays 1 and 2. In more detail, a trunk ground line 33 is arranged along the column direction in the programming areas 11 and 13 on which each branch ground line 23 and 23' provided in each row in the arrays 1 and 2 is connected to the trunk ground line 33 via a connecting portion 32 and 32'.

According to this feature, supply of the power voltage to the cells on a digit line including at least one defective cell in the main array and to the cells on a digit line or lines in the redundant array 2 which is not used to replace a digit line in the main array 1 is inhibited by cutting the corresponding connecting portion 32 or 32'.

FIG. 6 shows a detailed structure of the portion 12' in FIG. 5. The portions corresponding to those in FIGS. 4 and 5 are designated by the same reference numbers. The branch ground line 23, the connecting portion 32 and the trunk ground line 33 are made of single consecutive conductive layer such as an aluminum layer and the connecting portion is cut by a known laser cutting technique. The Vcc line 21 is extending in parallel with the word line 9 and made of a polycrystalline silicon.

FIG. 7 shows an example of a practical layout structure of the portion 12'.

The trunk ground line 33, the connecting portion 32 for power supply programming and the branch ground line 23 are made by single consecutive aluminum wiring layer. The branch ground line 23 is connected to the common source region 81 via a contact 85. The word line 9 is made of a vertically extending polycrystalline silicon and also serves as the gates of the transfer transistors 27-1 and 27-2. The pair of digit lines 24-1 and 24-2 are made of an aluminum wiring layer on the same level as the lines 23, 32 and 33, and connected to the drains (or sources) 77 and 78 of the transfer gate transistors 27-1 and 27-2. The source (or drain) of the transfer gate transistor 27-1 and the drain of the transistor 26-1 are made by a diffusion region 79 while the source (or drain) of the transistor 27-2 and the drain of the transistor 26-2 are made by a diffusion region 80. The gate of the transistor 26-1 is made of a polycrystalline silicon 76 connected to the region 80 and an end of the resistor 25-2 which is made of the polycrystalline silicon extended from the Vcc line 21 via a contact 87. The gate of the transistor 26-2 is made of a polycrystalline silicon connected to the region 79 via a contact 86. The region 79 is connected to an end of the resistor 25-1 made by the extended portion from the line 21 via contact 88.

In the case where there is at least one defective cell on the same digit line, the portion 32 is cut by a laser beam as shown by 37.

As has been described above, unnecessary power consumption or a leakage current in the memory device of the redundant type can be effectively avoided according to the present invention. Accordingly, a memory device which can satisfy all of the required characteristics can be obtained according to the present invention.

I claim:

1. A semiconductor memory device comprising a plurality of memory cells each including a flip-flop, said memory cells being divided into a plurality of first sections and at least one second section, all the memory cells of said first sections being not defective, at least one of the memory cells of said second section being defective, means for receiving address information, means responsive to said address information for addressing one of said first sections, a first common power supply line supplied with a first power voltage, a second common power supply line supplied with a second power voltage different from said first power voltage, a plurality of first branch power lines each provided for each of said first and second sections and adapted to supply said first power voltage thereto, the first branch power lines associated with said first sections being electronically connected to said first common power supply line, the first branch power line associated with said at least one second section being electrically isolated from a said first common power supply line, and a plurality of second branch power lines each provided for each of said first and second sections and adapted to supply said second power voltage thereto, the second branch power lines associated with said first sections being electrically connected to said second common power supply line, the second branch power line associated with said at least one second section being electrically isolated from said second power supply line.

2. The memory device according to claim 1, in which said memory cells are arranged in a matrix form of rows and columns and said sections are defined by the columns.

3. The memory device according to claim 1, in which each of said branch power lines is connected with said common power supply line via a connecting portion and the connecting portion of the branch power line associated with said at least one second section being cut.

4. A semiconductor memory device comprising a main array of memory cells arranged in rows and columns, a redundant array of memory cells arranged in at least one row and columns, said redundant array of memory cells being used to replace a defective row having a defective memory cell in said main array of memory cells, said main array and redundant array sharing the columns in common, means for receiving row address information, means responsive to said row address information and redundant information about said defective row for selecting one of the rows of said main array and said redundant array except said defective row, means for receiving column address information for selecting said columns, a first trunk power line, a plurality of first branch power lines each provided for each of the rows of said main array and said redundant array, the first branch lines associated with the rows other than said defective row being electrically connected to said first trunk power line thereby to supply a first power supply to the memory cells belonging to the rows other than said defective row, the first branch line associated with said defective row being electrically isolated from said first trunk power line, a second trunk power line, and a plurality of second branch lines each provided for each of the rows of said main array and said redundant array, the second branch lines associated with the rows other than said defective row being electrically connected to said second trunk power line to thereby supply a second power supply to the memory cells belonging to the rows other than said defective row, the second branch line associated with said defective row being electrically isolated from said second trunk power line, said first and second trunk lines being arranged in the direction of said columns.

5. The memory device according to claim 4, in which each of said memory cells includes a flip-flop circuit and a pair of transfer gate transistors for connecting a pair of input/output nodes of said flip-flop circuit to a pair of digit lines, the gates of said transfer gate transistors being connected to a word line.

6. The memory device according to claim 4, in which a word line is arranged in each of the rows and a pair of digit lines are arranged in each of the columns.

7. The memory device according to claim 4, in which each of said branch power lines is connected to the memory cells of the same row.

8. A semiconductor memory device comprising a main array of memory cells arranged in rows and columns, a redundant array of memory cells arranged in at least one row and columns, said redundant array of memory cells being used to replace a defective row having a defective memory cell in said main array of memory cells, said main array and redundant array sharing the columns in common, each of said memory cells including a flip-flop having first and second voltage terminals, means for receiving row address information, means responsive to said row address information and redundant information about said defective row for selecting one of the rows of said main array and said redundant array except said defective row, means for receiving column address information, means responsive to said column address information for selecting said columns, a first common power voltage line extending in the direction of said columns and formed apart from said main and redundant arrays, a plurality of first branch power voltage lines each provided in each of the rows of said main array and said redundant array and electrically connected to the first voltage terminals of the memory cells of each row, the first branch power voltage lines associated with the rows other than said defective row being electrically connected to said first common power voltage line, the first branch line associated with said defective row being electrically disconnected from said first common voltage line, a second common power voltage line extending in the direction of said columns and formed apart from said main and redundant arrays, a plurality of second branch power voltage lines each provided in each of the rows of said main array and said redundant array and electrically connected to the second voltage terminals of the memory cells of each row, the second branch power voltage lines associated with the rows other than said defective row being electrically connected to said second common power voltage line, the second branch line associated with said defective row being electrically disconnected from said second common voltage line.

9. The memory device according to claim 8, in which a word line is provided in each of the rows and a pair of digit lines are provided in each of the columns.

10. The memory according to claim 8, in which a pair of digit lines are provided in each of the rows and a word line is provided in each of the columns.

* * * * *